US005113139A

United States Patent [19]

Furukawa

[11] Patent Number: 5,113,139

[45] Date of Patent: May 12, 1992

[54] LOW-DISTORTION WAVEFORM GENERATING METHOD AND WAVEFORM GENERATOR USING THE SAME

[75] Inventor: Yasuo Furukawa, Gyoda, Japan

[73] Assignee: Advantest Corporation, Tokyo, Japan

[21] Appl. No.: 683,789

[22] Filed: Apr. 11, 1991

[30] Foreign Application Priority Data

Apr. 13, 1990 [JP] Japan .................................. 2-98552

[51] Int. Cl.[5] .............................................. G11C 27/02

[52] U.S. Cl. .............................. 324/623; 324/78 F; 324/620; 328/162; 328/165; 328/167

[58] Field of Search ..................... 324/620, 623, 78 F; 328/162, 165, 167

[56] References Cited

U.S. PATENT DOCUMENTS

| | | | |
|---|---|---|---|
| 3,355,668 | 11/1967 | Boensel | 328/162 |
| 3,525,052 | 8/1970 | Clark | 328/162 |
| 3,906,383 | 9/1975 | Andre | 328/165 |
| 4,093,923 | 6/1978 | McCormick | 328/165 |
| 4,232,400 | 11/1980 | Yamamoto | 328/165 |
| 4,340,854 | 7/1982 | Jones | 328/162 |
| 4,696,017 | 9/1987 | Masheff | 328/162 |
| 4,698,597 | 10/1987 | Merli | 328/165 |
| 5,023,565 | 1/1991 | Lieu | 328/162 |

*Primary Examiner*—Kenneth A. Wieder
*Assistant Examiner*—Jose M. Solis
*Attorney, Agent, or Firm*—Staas & Halsey

[57] ABSTRACT

Waveform data read out of a memory is converted by a D/A converter into an analog waveform, and amplified by an amplifier to generate a waveform signal. To cancel a distortion generated in the amplifier, a composite waveform composed of a distortion canceling signal waveform and a fundamental frequency signal waveform to be generated is written into the memory. To determine a distortion canceling signal, the fundamental frequency component in the signal waveform is attenuated by a notch filter. The signal waveform is then converted by an A/D converter into a digital multi-sine waveform. This waveform is input to a computation and control part and subjected to a Fourier transform analysis to compute the amplitude and phase of each harmonic component. Further, the output of the amplifier the memory, is fed via the notch filter and the A/D is input to the computation and control part, where it is subjected to a Fourier transform analysis to compute the amplitude and phase of each distortion component. At the same time, the output of the amplifier is converted into digital waveform data without being applied to the notch filter and the data is subjected to a Fourier transform analysis in the computation and control part. The amplitude and phase of the fundamental frequency component are then computed. Based on the results of these Fourier transform analyses, the amplitude and phase of each frequency component of the distortion canceling signal are determined and are used to compute composite waveform data composed of the distortion canceling signal and the fundamental frequency signal.

4 Claims, 4 Drawing Sheets

LOW-DISTORTION WAVEFORM GENERATING METHOD AND WAVEFORM GENERATOR USING THE SAME

BACKGROUND OF THE INVENTION

The present invention relates to a low-distortion waveform generating method in which waveform data read out of a memory is D-A converted to obtain a sine wave or similar waveform output. The invention also pertains to a waveform generator which utilizes such a waveform generating method.

A conventional waveform generator of this kind is provided with a memory 12, a D/A converter 13, a low-pass filter 14 and an amplifier 15 as shown in FIG. 1. In the memory 12 there is prestored waveform data of one cycle of a waveform which is to be ultimately obtained. For example, in the case of obtaining a sinusoidal waveform output, waveform data of one cycle of a sine wave is prestored. The waveform data is repeatedly read out of the memory 12 and the read-out waveform data is converted by the D/A converter 13 into an analog signal, which is applied to the low-pass filter 14 to remove a sample clock component. The output signal of the low-pass filter 14 is amplified by the amplifier 15, from which an output waveform is provided.

In the case of obtaining a low-frequency waveform output with the above conventional waveform generator, it is possible to obtain a low-distortion output waveform which is substantially faithful to the waveform desired to be ultimately obtained, because a low-distortion, low-frequency amplifier can be implemented as the amplifier 15. In the case of obtaining a waveform output of as high a frequency as hundreds of kilo-hertz to several mega-hertz or in the case of varying the frequency of the waveform output over a wide band, however, the prior art waveform generator cannot yield a low-distortion output waveform substantially faithful to the waveform desired to be ultimately obtained. This is because it is difficult to implement, as the amplifier 15, a low-distortion high-frequency amplifier or an amplifier capable of producing a low-distortion output over a wide band.

SUMMARY OF THE INVENTION

It is therefore an object of the present invention to provide a waveform generating method which permits the production of a remarkably low-distortion output waveform even if it is high-frequency or its frequency is varied over a wide band, in a waveform generator of the type that reads out waveform data from a memory and converts it to analog form to thereby obtain a sine-wave or similar waveform output.

Another object of the present invention is to provide a waveform generator utilizing the above-mentioned method.

According to the present invention, there are provided a waveform generating part including a memory which waveform data can be written into and read out from, a D/A converter for D/A converting the waveform data read out of the memory, and an amplifier for amplifying the output signal of the D/A converter. A distortion measuring part is provided which includes a filter for attenuating the fundamental frequency component from the output signal of the amplifier, a first A/D converter for A/D converting the output signal of the filter, and a second A/D converter for A/D converting the output signal of the amplifier. A computation and control part is also provided which performs a Fourier transform analysis of the output waveform data of each of the A/D converters to determine a cancel waveform for cancelling a distortion generated in the waveform generating part, for creating composite waveform data composed of the cancel waveform and the fundamental frequency waveform to be generated, and for writing the composite waveform data into the memory.

To determine the distortion cancel waveform, a multi-sine waveform, which is composed of a plurality of 10 sine waves of the same amplitude and having the same frequencies as those harmonic components forming distortion components, is read out of the memory. The multi-sine waveform signal is output from the waveform generating part. The output multi-sine waveform signal is subjected to the attenuation of its fundamental frequency component by the filter, after which it is converted to a digital waveform. It is then applied to the computation and control part, wherein the amplitude and phase of each frequency component are computed by a Fourier transform analysis to thereby determine amplitude/phase characteristics of the waveform generating part which also contain the influence of the filter. Next, the fundamental frequency sine wave is read out of the memory and a waveform signal output from the waveform generating part, based on the read-out sine wave, is applied to the filter to attenuate the fundamental frequency component. The output of the filter is fed to the computation and control part, wherein it is subjected to the Fourier transform analysis to thereby compute the amplitude and phase of each distortion component. A waveform signal output from the waveform generating part, which is not provided to the filter, is subjected to the Fourier transform analysis to compute the amplitude and phase of the fundamental frequency component which are free from the influence of the filter. The amplitude and phase of the fundamental frequency component thus obtained are combined with those of each distortion component to determine a distortion characteristic of the waveform generating part which contains the influence of the filter. Based on the thus determined amplitude/phase characteristics and the distortion characteristic of the waveform generating 10 part, a composite waveform is determined through computation for canceling each distortion component which results from the application of the fundamental frequency signal to the waveform generating part.

With the waveform generator of the above construction according to the present invention, waveform data, whose distortion is canceled when it is amplified by the amplifier in the waveform generating part after being written into and read out of the memory in the waveform generating part and then D/A converted by the D/A converter in the waveform generating part, is prepared in the computation and control part, based on output data of each A/D converter in the distortion measuring part. This waveform data is written into the memory in the waveform generating part. Thereafter, the waveform data is read out of the memory in the waveform generating part, the read-out waveform data is converted by the D/A converter in the waveform generating part to an analog signal and the output signal of the D/A converter is amplified by the amplifier in the waveform generating part. Thus, a low-distortion waveform is obtained as the output waveform of the waveform generating part.

DESCRIPTION OF THE PREFERRED EMBODIMENTS

Figure 1:
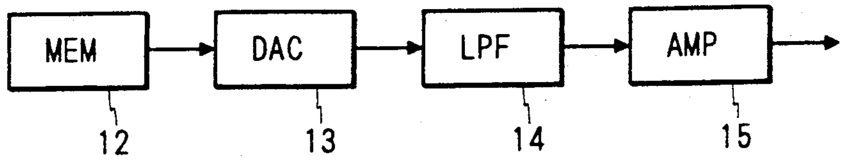
FIG. 1 PRIOR ART
FIG. 1 is a block diagram showing a conventional waveform generator.
Figure 2:
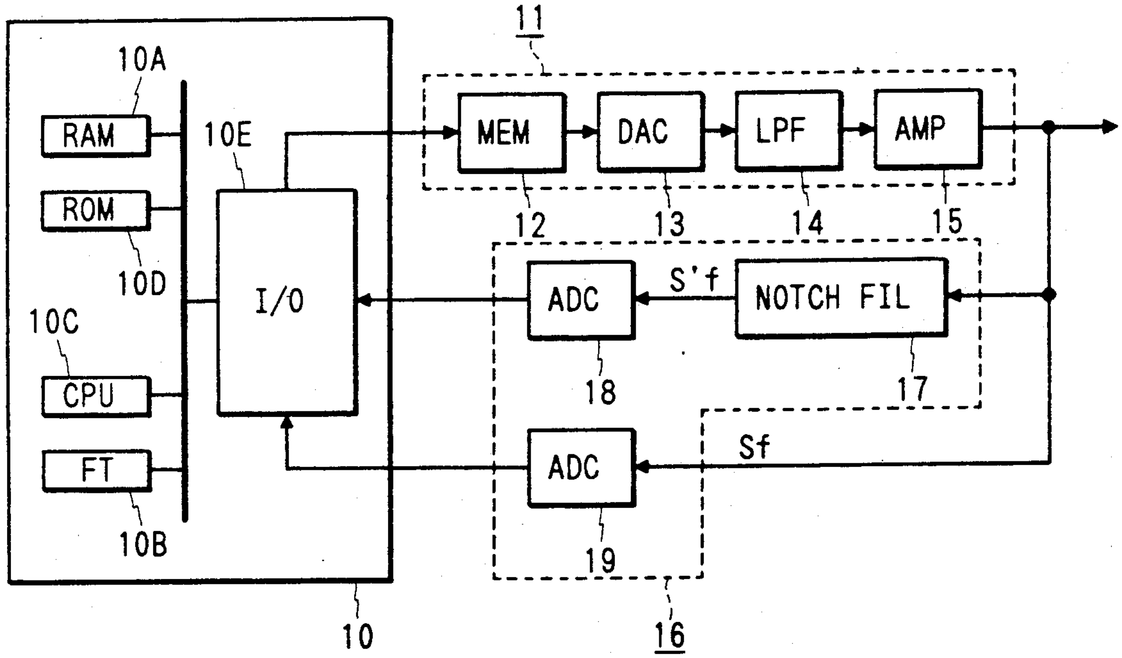
FIG. 2 is a block diagram illustrating a first embodiment of the waveform generator according to the present invention.

FIG. 2 is a block diagram of a first embodiment of the waveform generator according to the present invention.

The waveform generator of this embodiment has a waveform generating part 11, a distortion measuring part 16 and a computation and control part 10. The waveform generating part 11 includes a memory 12 into which waveform data can be written and from which it can be read out, such as a RAM; a D/A converter 13 for D/A converting the waveform data read out of the memory 12; a low-pass filter 14 for removing a clock component from the output signal of the D/A converter 13; and an amplifier 15 for amplifying the output signal of the low-pass filter 14. The distortion measuring part 16 includes: a notch filter 17 which is supplied with the output signal of the amplifier 15; an A/D converter 18 for A/D converting the output signal of the notch filter 17; and an A/D converter 19 for A/D converting the output signal of the amplifier 15. The computation and control part 10 includes: a RAM 10A for writing therein and reading out therefrom data; a Fourier transform analysis section 10B for making a Fourier transform analysis of input waveform data; a CPU 10C for controlling the operation of the device and for performing required computations; a ROM 10D having stored therein an operation program of the device; and an I/O interface 10E. The CPU, ROM and I/O interface form a typical microcomputer. Since it is well known to a skilled person how to utilize the functions of a CPU, RAM, ROM and I/O interface to execute desired operations, various operations to be performed by the computation and control part will be described without referring to specific part in the computation and control part 10.

Assuming that the waveform to be ultimately obtained is a sine wave expressed by S=sinωt and that waveform data corresponding to the sine wave, that is, waveform data faithful to the sine wave is prestored in the memory 12, the output waveform obtainable from the waveform generating part 11 by applying the sine wave data, read out of the memory 12, to the D/A converter 13, the low-pass filter 14 and the amplifier 15 contains a distortion caused mainly by the amplifier 15 and hence is expressed as follows:

$$\begin{aligned} Sa = {} & K_1 \sin(\omega t + \delta_1) \\ & + A_2 \sin(2\omega t + \theta_2) \\ & + A_3 \sin(3\omega t + \theta_3) \\ & \vdots \\ & + A_n \sin(n\omega t + \theta_n) \end{aligned} \tag{1}$$

where $K_1$ is the amplitude of a first order signal component (i.e. the fundamental frequency component) in the output waveform, letting the amplitude of the sine wave indicated by the waveform data written into the memory 12 be represented by 1, and $\delta_1$ is the total phase shift amount of the signal component in the low-pass filter 14 and the amplifier 15.

Accordingly, by prestoring waveform data in the memory 12 which includes second and higher harmonic components (distortion components) in Expression (1) inverted in phase, and taking into account the amplitude and phase variations of both the low-pass filter 14 and the amplifier 15 as expressed by the following Expression (2):

$$\begin{aligned} Sc = {} & \sin(\omega t) \\ & - (A_2/K_2)\sin(2\omega t + \theta_2 - \delta_2) \\ & - (A_3/K_3)\sin(3\omega t + \theta_2 - \delta_2) \\ & \vdots \\ & - (A_n/K_n)\sin(n\omega t + \theta_n - \delta_n) \end{aligned} \tag{2}$$

and by generating a waveform from the waveform generating part 11, based on the above waveform data read out of the memory 12, it is possible to obtain an output waveform substantially free from the second and higher harmonic components in Expression (1). That is, the signal component sinωt in Expression (2) generates the second and higher harmonic components shown in Expression (1) in the amplifier 15. However, these harmonic components are canceled by selecting the values of $K_2, K_3, \ldots, K_n$ and $\delta_2, \delta_3, \ldots, \delta_n$ such that the passage of the waveform Sc of Expression (2) through the low-pass filter 14 and the amplifier 15 will make the second and higher harmonic components in Expression (2) such as follows:

$$\begin{aligned} Se = {} & -A_2 \sin(2\omega t + \theta_2) \\ & - A_3 \sin(3\omega t + \theta_3) \\ & \vdots \\ & - A_n \sin(n\omega t + \theta_n) \end{aligned} \tag{3}$$

Consequently, the output waveform of the amplifier 15 is composed only of the first order signal component and is distortion-free.

Yet, the second and higher harmonic components in Expression (2) cause distortions mainly in the amplifier. These distortions may be ignored because they are far smaller than the second and higher harmonic distortion components in Expression (1) which are produced in the amplifier 15 by the first order signal component in Expression (2). Further, since the distortion component usually becomes smaller in amplitude as the harmonic order rises, it would suffice to take into account the second and higher harmonic components in Expression (1) up to approximately a tenth harmonic. Accordingly n in Expression (2) may be set to 10 or so.

The above-mentioned coefficients $K_1, K_2, K_3, \ldots K_n$ and the phases $\delta_2, \delta_3, \ldots, \delta_n$ can be measured by reading out signal waveforms $\sin\omega t$, $\sin 2\omega t$, $\sin 3\omega t, \ldots, \sin\omega t$ of the same amplitude from the memory 12 and by analyzing the resulting output signals from the waveform generating part 11 through the Fourier transformation. For instance, for simultaneous analysis of the output signals by the Fourier transformation, signal waveform data given by the following Expression (4) is written into the memory 12 and is then read out therefrom. The resulting signal Sf output from the waveform generating part 11 is subjected to the Fourier 10.

$$Sg = \sin\omega t - (\sin 2\omega t + \sin 3\omega t + \ldots + \sin n\omega t) \quad (4)$$

In the amplifier 15, by regarding each frequency component of the signal Sg given by Expression (4) as the fundamental frequency signal and by ignoring its harmonic distortion components (since their amplitudes are sufficiently smaller than that of each fundamental wave signal), the signal Sf available from the waveform generating part 11 can be approximated by the following expression, because each fundamental wave signal in Expression (4) undergoes amplitude and phase variations in the low-pass filter 14 and the amplifier 15.

$$\begin{aligned} Sf = {} & K_1 \sin(\omega t + \delta_1) \\ & - K_2 \sin(2\omega t + \delta_2) \\ & - K_3 \sin(3\omega t + \delta_3) \\ & \cdot \\ & \cdot \\ & \cdot \\ & - K_n \sin(n\omega t + \delta_n) \end{aligned} \quad (5)$$

Thus, the amplitude $K_i$ and the phase $\delta_i$ of each frequency component can be determined by the Fourier transform analysis of the signal Sf. The analysis of the amplitude and phase of each frequency component will hereinafter be referred to as the analysis of the amplitude/phase characteristics of the waveform generating part 11.

On the other hand, by reading out waveform data $\sin\omega t$ from the memory 12 and by conducting the Fourier transform analysis of the resulting output signal from the waveform generating part 11, amplitudes $A_2, A_3, \ldots, A_n$ and phases $\theta_2, \theta_3, \ldots, \theta_n$ of respective harmonic components (i.e. distortion components) relative to the output fundamental harmonic component are determined as shown by Expression (1). This analysis will hereinafter be referred to as the analysis of the distortion characteristic of the waveform generating part 11. A sine wave $\sin\omega t$ of low distortion could be provided from the waveform generating part 11 by determining the waveform data of Expression (2) through utilization of the results of analyses of the amplitude/phase characteristics and the distortion characteristic, storing the determined waveform data in the memory 12 and then reading out therefrom the waveform data at the time of waveform generation.

In the actual analysis of the distortion characteristic, however, if the output waveform of the waveform generating part 11 is subjected intact to the Fourier transform analysis, the resulting values of the amplitudes $A_2, A_3, \ldots, A_n$ of the distortion components are not accurate. This is because these amplitudes are appreciably smaller than the amplitude of the fundamental harmonic component in the output waveform of the waveform generating part 11, that is, $K_1$ in Expression (1). In view of the above, if the signal component (the fundamental wave component) of the frequency $\omega$ is suppressed equal to or smaller than its harmonic components through use of the notch filter 17 shown in FIG. 2 and if the output signal of the notch filter 17 is subjected to the Fourier transform analysis with a high gain, then the amplitudes $A_2, A_3, \ldots, A_n$ can be determined with high accuracy. However, these harmonic components also undergo amplitude and phase variations by the notch filter 17. Taking into account the amplitude and phase variations by the notch filter 17, the present invention determines the waveform data shown by Expression (2), following the flowcharts depicted in FIGS. 2, 3 and 4 as described hereinbelow.

Figure 3:
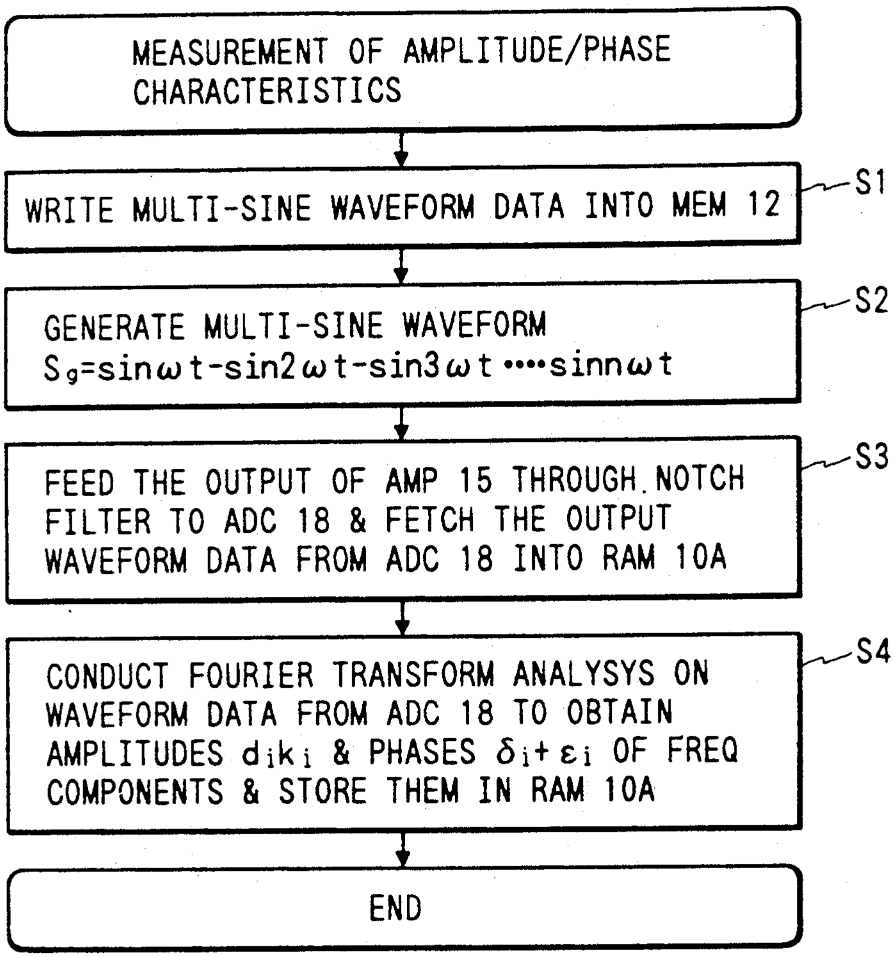
FIG. 3 is a flowchart showing the process for measuring amplitude/phase characteristics in the waveform generating method according to the present invention.

At first, an analysis of the amplitude/phase characteristics, inclusive of the influence of the notch filter 17, is made following the flowchart depicted in FIG. 3. In step S1 sample data of the multi-sine signal waveform Sg given by Expression (4), provided from the computation and control part 10, is stored in the memory 12. In the next step S2 the sample data of the signal waveform Sg are sequentially read out of the memory 12, and the resulting signal Sf available from the waveform generating part 11, given by Expression (5), is supplied to the distortion measuring part 16. As a result of this, the output signal S'f of the notch filter 17 is given by the following expression:

$$\begin{aligned} S'f = {} & d_1 \cdot K_1 \sin(\omega t + \delta_1 + \epsilon_1) \\ & - d_2 \cdot K_2 \sin(2\omega t + \delta_2 + \epsilon_2) \\ & - d_3 \cdot K_3 \sin(3\omega t + \delta_3 + \epsilon_3) \\ & \cdot \\ & \cdot \\ & \cdot \\ & - d_n \cdot K_n \sin(n\omega t + \delta_n + \epsilon_n) \end{aligned} \quad (6)$$

Where $d_1, d_2, \ldots, d_n$ and $\epsilon_1, \epsilon_2, \ldots, \epsilon_n$ are amplitude coefficients and phase shift amounts which are imparted by the notch filter 17 to the respective frequency components. In step S3 the waveform of the output signal S'f from the notch filter 17 is converted by the A/D converter 18 into a digital waveform, which is fed into the RAM 10A of the computation and control part 10. In step S4 the computation and control part 10 makes a Fourier transform analysis of a series of sample values of the signal waveform S'f to obtain values of amplitudes $d_1 \cdot K_1, d_2 \cdot K_2, \ldots, d_n \cdot K_n$ and phases $\delta_1+\epsilon_1, \delta_2+\epsilon_2, \ldots, \delta_n+\epsilon_n$ of components of respective frequencies $\omega t, 2\omega t, \ldots, n\omega t$, these values being stored in the RAM 10a. In this instance, the values $d_1 \cdot K_1$ and $\delta_1+\epsilon_1$ are not used.

Figure 4:
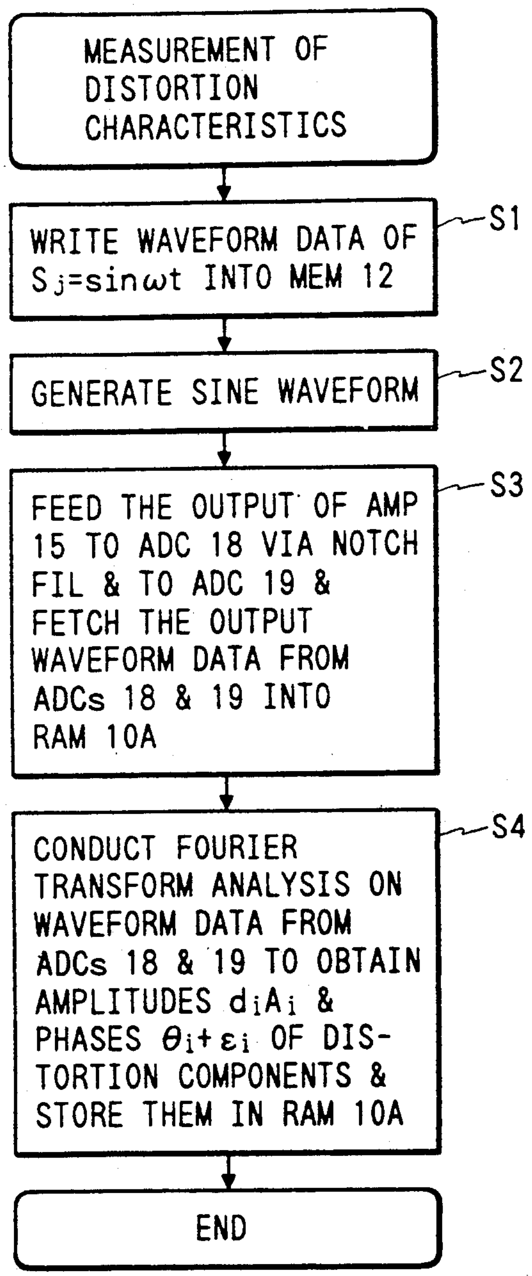
FIG. 4 is a flowchart showing the process for measuring a distortion characteristic in the method of the present invention.

Next, an analysis of the distortion characteristic, inclusive of the influence of the notch filter 17, is conducted following the flowchart depicted in FIG. 4. In step S1 signal waveform data $Sj = \sin\omega t$ is written into the memory 12 from the computation and control part 10. In step S2 the sample data of the signal waveform Sj are sequentially read out of the memory 12 and the resulting signal Sa available from the waveform generating part 11, expressed by Expression (1), is applied to the distortion measuring part 16. As a result of this, the output signal S'a of the notch filter 17 is given by the following expression:

$$S'a = d_1 \cdot K_1 \sin(\omega t + \delta_1 + \epsilon_1) + d_2 \cdot A_2 \sin(2\omega t + \theta_2 + \epsilon_2) + d_3 \cdot A_3 \sin(3\omega t + \theta_3 + \epsilon_3) \cdots + d_n \cdot A_n \sin(n\omega t + \theta_n + \epsilon_n) \quad (7)$$

In Step S3 the waveform of the output signal S'a from the notch filter 17 is converted by the A/D converter 18 to a digital waveform, which is provided to the computation and control part 10. Further, the waveform of the signal Sa which is provided from the waveform generating part 11 at the same time, given by Expression (1), is converted by the A/D converter 19 to a digital waveform at the same timing as the A/D converter 18, and this digital waveform is also provided to the computation and control part 10. In step S4 the computation and control part 10 conducts, a high gain. Fourier transform analysis of the digital signal waveform S'a corresponding to Expression (7) to obtain values of amplitudes $d_2 \cdot A_2$, $d_3 \cdot A_3$, . . . , $d_n \cdot A_n$ and phases $\theta_2+\epsilon_2$, $\theta_3+\epsilon_3$, . . . , $\theta_n+\epsilon_n$ of components of respective frequencies $2\omega t$, $3\omega t$, . . . , $n\omega t$, these values being stored in the RAM 10A. The computation and control part 10 also performs a Fourier transform analysis of the digital signal waveform Sa corresponding to Expression (1) and stores the amplitude $K_1$ and the phase $\delta_1$ of the component of the fundamental frequency $\omega$ in the RAM 10A, discarding information on the other components. Of course, it makes no difference to the invention which of the analyses of the amplitude/phase characteristics in FIG. 3 and the distortion characteristic in FIG. 4 is performed first.

Figure 5:
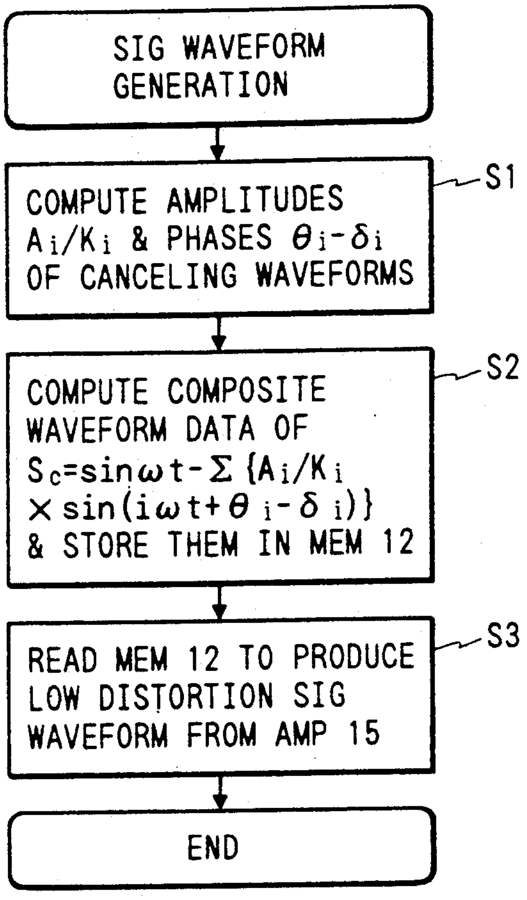
FIG. 5 is a flowchart showing the process for waveform generation in the method of the present invention.

Then, the waveform given in Expression (2) is determined following the flowchart shown in FIG. 5. The waveform thus obtained is used to generate the desired waveform $\sin\omega t$. In step S1 the computation and control part 10 reads out of the RAM 10A the amplitude data $d_2 \cdot K_2$, $d_3 \cdot K_3$, . . . , $d_n \cdot K_n$ in Expression (6) and the amplitude data $d_2 \cdot A_2$, $d_3 \cdot A_3$, . . . , $d_n \cdot A_n$ in Expression (7), computes $(d_2 \cdot A_2)/(d_2 \cdot K_2)=A_2/K_2$ and similarly obtains $A_3/K_3$, . . . , $A_n/K_n$. Moreover, the computation and control part 10 reads out of the RAM 10A the phase data $\delta_2+\epsilon_2$, $\delta_3+\epsilon_3$, . . . , $\delta_n+\epsilon_n$ in Expression (6) and the phase data $\theta_2+\epsilon_2$, $\theta_3+\epsilon_3$, . . . , $\theta_n+\epsilon_n$ in Expression (7), computes $(\theta_2+\epsilon_2)-(\delta_2+\epsilon_2)=\theta_2-\delta_2$ and similarly obtains $\theta_3-\delta_3$, . . . , $\theta_n-\delta_n$. The waveform Sc by Expression (2) is computed using the above computed results and the amplitude $K_1$ and the phase $\delta_1$ read out of the RAM 10A, and the waveform data thus obtained is stored in the RAM 10A. In step S2 the sample data of the waveform Sc are sequentially read out of the RAM 10A and written into the memory 12. In step S3 the sample data of the waveform Sc in the memory 12 are sequentially read out therefrom and converted by the D/A converter 13 to analog form for output via the low-pass filter 14 and the amplifier 15.

As a result of the above operation, the components of the frequencies $2\omega$, $3\omega$, . . . , $n\omega$ in Expression (2) and harmonic components, which are derived from the component of the frequency $\omega$ in the amplifier 15, cancel each other, providing a low-distortion sine wave $K_1\sin(\omega t+\delta_1)$. From the above it is evident to those skilled in the art to modify, in advance, the waveform Sc of Expression (2) so that the amplitude $K_1$ and the phase $\delta_1$ may be of desired values. While in the above the amplitude $K_1$ and the phase $\delta_1$ are obtained in steps S3 and S4 shown in FIG. 4, they may also be determined by performing, in step S4 in FIG. 3, a Fourier transform analysis of those samples of the waveform given by Expression (5) which are obtained by the A/D converter 19 at the same timing as the A/D converter 18 in step S3 in FIG. 3.

Figure 6:
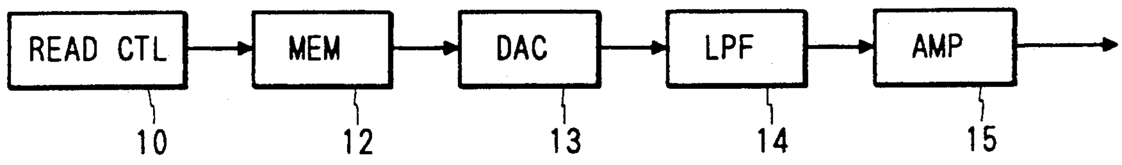
FIG. 6 is a block diagram illustrating a second embodiment of the present invention.

FIG. 6 is a block diagram of a second embodiment of the waveform generator of the present invention.

In the second embodiment the memory 12 is a non-volatile memory such as a ROM. The waveform data expressed by Expression (2) mentioned previously is prestored therein. In the case of obtaining a waveform output of a sine wave, the waveform data written into the memory 12 is read out thereof by a read controller 10. The waveform thus read out is converted by the D/A converter 13 to an analog signal. The output signal from the D/A converter 13 is applied to the low-pass filter 14, wherein its clock component is removed. The output signal from the low-pass filter 14 is amplified by the amplifier 15, from which is obtained an output waveform. Therefore, the output waveform is distortion-free as in the case of FIG. 2.

Figure 7:
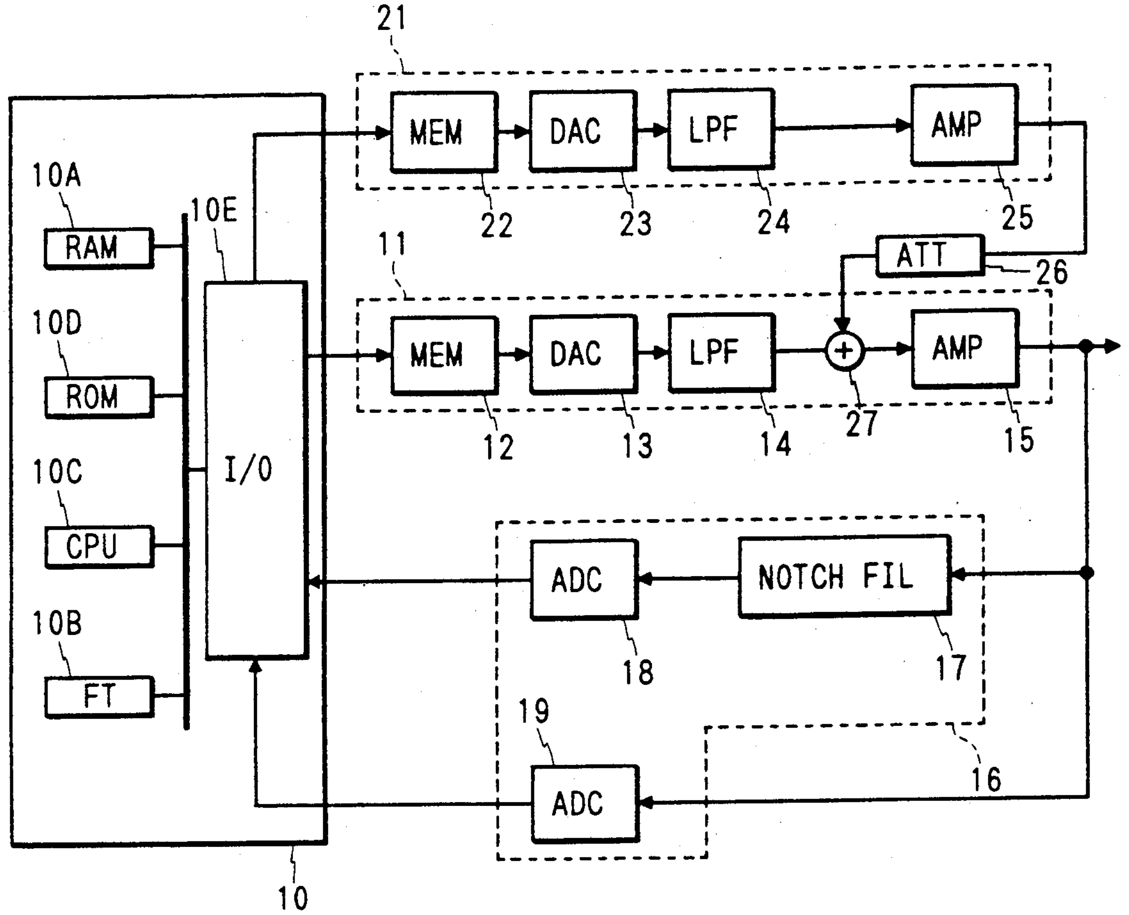
FIG. 7 is a block diagram illustrating a third embodiment of the present invention.

FIG. 7 is a block diagram of of a third embodiment of the waveform generator of the present invention.

The waveform generator of the third embodiment comprises a main waveform generating part 11, a distortion measuring part 16, a computation and control part 10 and a distortion canceling waveform generating part 21. As is the case with the waveform generating part 11 in the embodiment in FIG. 2, the main waveform generating part 11 includes a memory 12 into which waveform data can be written and from which it can be read out, such as a RAM; a D/A converter 14 for D/A converting the waveform data read out of the memory 12; a low-pass filter 14 for removing a clock component from the output signal of the D/A converter 13; and an amplifier 15 for amplifying the output signal of the low-pass filter 14. The distortion measuring part 16 includes a notch filter 17 which is supplied with the output signal from the amplifier 15, an A/D converter 18 for A/D converting the output signal of the notch filter 17, and an A/D converter 19 for A/D converting the output signal of the amplifier 15, as is the case with the distortion measuring part 19 used in the FIG. 2. The distortion canceling waveform generating part 21 includes a memory 22 into which waveform data can be written and from which it can be read out, such as a RAM; a D/A converter 23 for D/A converting the waveform data read out of the memory 22; a low-pass filter 24 for removing a clock component from the output signal of the D/A converter 23; and an amplifier 25 for amplifying the output signal of the low-pass filter 24. The output of the amplifier 25 is applied via an attenuator 26 to an adder 27 provided at the input of the amplifier 15 in the main waveform generating part 11 and is added to the output signal of the low-pass filter 14. The added output is amplified by the amplifier 15 and then output as a low-distortion sine-wave signal.

In the embodiment shown in FIG. 7, at first, waveform data of the multi-sine signal Sg given by Expression (4) is written into the memory 12 from the computation and control part 10 and is then read out from the memory 12 by the computation and control part 10. As a result of this, in the computation and control part 10 the amplitude data $d_2 \cdot K_2$, $d_3 \cdot K_3$, . . . , $d_n \cdot K_n$ and the phase data $\theta_2+\epsilon_2$, $\theta_3+\epsilon_3$, . . . , $\theta_n+\epsilon_n$ in Expression (6), which contain the amplitude/phase characteristics of the notch filter 17, are measured and the measured results are stored in the RAM 10A, as is the case in FIG. 2. Following this, waveform data expressed by $SJ=\sin\omega t$ is written into the memory 12 from the computation and control part 10 and is then read out of the memory 12 by the computation and control part 10. As a result of this, in the computation and control part 10 the amplitude data $d_2 \cdot A_2$, $d_3 \cdot A_3$, . . . , $d_n \cdot A_n$ and the phase data $\theta_2+\epsilon_2$, $\theta_3+\epsilon_3$, . . . , $\theta_n+\epsilon_n$ in Expression (7) are obtained by Fourier transform analysis. Further the amplitude coefficients $A_2/K_2$, $A_3/K_3$, . . . , $A_n/K_n$ and the phases $\theta_2-\delta_2$, $\theta_3-\delta_3$, . . . , $\theta_n-\delta_n$ are computed and stored in the RAM 10A. For generating the distortion canceling waveform, these computed results are used to compute the following waveform data (Expression (8)) which is a composite waveform of the second and higher harmonic components in Expression (2). The waveform data thus obtained is written into the memory 22 of the distortion canceling waveform generating part 21:

$$
\begin{aligned}
Sd = & -(A_2/K_2)\sin(2\omega t + \theta_2 - \delta_2) \\
& - (A_3/K_3)\sin(3\omega t + \theta_3 - \delta_3) \\
& \cdot \\
& \cdot \\
& \cdot \\
& - (A_n/K_n)\sin(n\omega t + \theta_n - \delta_n)
\end{aligned}
\tag{8}
$$

Further, the waveform data $\sin\omega t$ is written into the memory 12 in advance. Incidentally, when the value of the waveform data to be written into the memory 22 is selected to be, for example, 1000-fold, so that it may be equivalent to the value of the waveform data to be written into the memory 12 and the 1000-fold value is attenuated by the attenuator 26 down to 1/1000, it is possible to supply a highly accurate distortion canceling waveform to the adder 27. When the distortion canceling signal waveform read out of the memory 22 is amplified by the amplifier 25, the waveform is distorted, but the distortion components are sufficiently smaller than the level of the cancelling signal waveform and are further attenuated by the attenuator 26, and hence they are negligible. Thereafter, the waveform data expressed by $Sj=\sin\omega t$ and the waveform data expressed by the Expression (8) are read out by the same timing clock from the memories 12 and 22, respectively. The readout waveform data are converted by the D/A converters 13 and 23 to analog signals which are applied to the low-pass filters 14 and 24 to remove clock components from the analog signals. The output signal of the low-pass filter 24 is amplified by the amplifier 25. Its output signal is applied via the attenuator 26 to the adder 27, wherein it is added to the output signal of the low-pass filter 14. The added output is amplified by the amplifier 15 to obtain a sine waveform having distortion components canceled therefrom. Accordingly, the output waveform is distortion-free.

Figure 8:
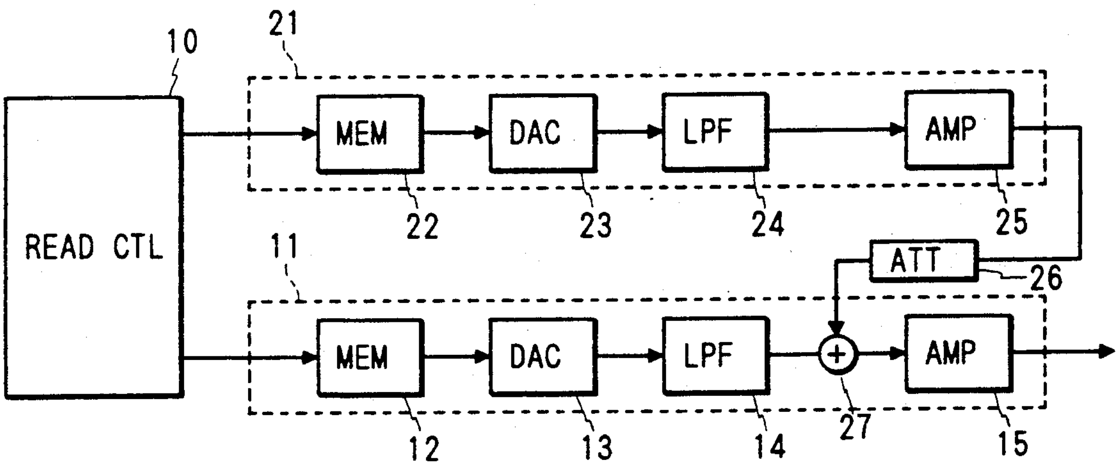
FIG. 8 is a block diagram illustrating a fourth embodiment of the present invention.

FIG. 8 is a block diagram of a fourth embodiment of the waveform generator of the present invention.

In the fourth embodiment, the memory 12 in the main waveform generating part 11 and the memory 22 in the distortion canceling waveform generating part 22 are each a nonvolatile memory such as a ROM. When obtaining a sine waveform, the waveform data expressed by $Sj=\sin\omega t$ and the waveform data given by Expression (8) are prestored in the memories 12 and 22, respectively. The respective waveform data are read out by the read controller 10 from the memories 12 and 22 and are then converted by the D/A converters 13 and 23 to analog signals. The output signals of the D/A converters 13 and 23 are applied to the low-pass filters 14 and 24, wherein clock components are removed from them. The output signal of the low-pass filter 24 is amplified by the amplifier 25 and is applied via the attenuator 26 to the adder 27. It is then added to the output signal of the low-pass filter 14. The added output is amplified by the amplifier 15, and a distortion-canceled output waveform is obtained. Accordingly, the output waveform is free from distortion.

As described above, according to the present invention, an extremely low-distortion output waveform can be obtained even when a high-frequency waveform output is obtained and when the frequency of the waveform output is varied over a wide band.

It will be apparent that many modifications and variations may be effected without departing from the scope of the novel concepts of the present invention.

What is claimed is:

1. A waveform generator comprising:

a waveform generating part including:

memory means into which waveform data can be written and from which said data can be read out;

D/A converter means for D/A converting said waveform data read out from said memory means; and amplifier means for amplifying the output signal of said D/A converter means;

a distortion measuring part including:

filter means for attenuating a particular frequency component from the output signal of said amplifier means; and A/D converter means for A/D converting the output signal of said filter means; and a computation and control part, operatively connected to said distortion measuring part, and said waveform generating part, which performs a Fourier transform analysis of the output data of said A/D converter means, decides, based on the analyzed result, distortion canceling harmonic components for canceling distortion components which are produced in said waveform generating part, writes into said memory means waveform data composed of a waveform component to be generated and said distortion canceling harmonic components, and reads out said waveform data from said memory means during waveform generation, said computation and control part comprising:

temporary storage means; and

Fourier transform analysis means, said computation and control part fetching thereinto via said distortion measuring part a waveform signal provided from said waveform generating part when reading out a reference signal waveform from said memory means, determining amplitudes and phases of distortion components in the output waveform signal of said waveform generating part by performing a Fourier transform analysis of said fetched waveform signal with said Fourier transform analysis means and write said amplitudes and phases of said distortion components into said memory means, fetching thereinto said output waveform signal of said waveform generating part via said A/D converter means without passing through said filter means, determining an amplitude and a phase of a fundamental frequency component of said reference signal waveform by performing a Fourier transform analysis of said fetched output waveform signal with said Fourier transform analysis means and writing said amplitude and phase of said fundamental frequency component into said temporary storage means, fetching thereinto via said distortion measuring part an output waveform signal of said waveform generating part when a composite waveform is read out of said memory means and composed of harmonic components each having a predetermined amplitude and phase and the frequency of a corresponding one of said distortion components, determining amplitude/phase characteristics of said waveform generating part with respect to each of said harmonic components by performing a Fourier transform analysis of said fetched output waveform signal with said Fourier transform analysis means, and writing said amplitude/phase characteristics into said temporary storage means, computing amplitudes and phases of said distortion canceling harmonic components for canceling said distortion components, based on said determined amplitudes and phases of said distortion components, said determined amplitude and phase of said fundamental frequency component and said determined amplitude/phase characteristic written in said temporary storage means, and writing into said memory means waveform data composed of said canceling harmonic waveform components determined by said computed amplitudes and phases and said reference signal waveform.

2. A waveform generating method in which waveform data read out of a memory by a computation and control part is converted by a D/A converter to an analog waveform, the analog waveform is amplified by an amplifier and a waveform signal is generated as the output of a waveform generating part, said method comprising the steps of:

(a) writing, into the memory, data of a multi-sine waveform which is a composite waveform composed of n sine waves respectively having a fundamental frequency ω of a signal waveform to be generated and two-fold, three-fold, . . . , n-fold harmonic frequencies, each having a predetermined amplitude;

(b) reading out said multi-sine waveform said the memory, converting the multi-sine waveform by the D/A converter to an analog waveform and amplifying the analog waveform by the amplifier to thereby output the multi-sine waveform;

(c) applying the multi-sine waveform from the amplifier to a filter to attenuate the component of the fundamental frequency ω, converting the output of the filter by an A/D converter to digital multi-sine waveform data and fetching the digital multi-sine waveform data into the computation and control part;

(d) measuring amplitude/phase characteristics of the waveform generating part, inclusive of the influence of the filter, by obtaining the amplitude and phase of each of the harmonic frequency components through a Fourier transform analysis of the fetched digital multi-sine waveform data;

(e) writing the signal waveform data of the fundamental frequency to be generated into the memory;

(f) reading out the signal waveform data of the fundamental frequency ω from the memory, converting the read-out signal waveform data by the D/A converter to an analog waveform, amplifying the analog waveform by the amplifier and outputting the amplified analog waveform;

(g) applying the analog signal waveform from the amplifier to the filter to attenuate the component of the fundamental frequency, converting the output of the filter by the digital signal waveform into the computation and control part;

(h) measuring a distortion characteristic of the waveform generating part, inclusive of the influence of the filter, by obtaining amplitudes and phases of harmonic distortion components with respect to the fundamental frequency ω through a Fourier transform analysis of the fetched digital signal waveform;

(i) determining, based on the measured amplitude/-phase characteristics and the measured distortion characteristic, the amplitude and phase of each distortion canceling sine signal waveforms of frequencies 2ω, 3ω, . . . , nω for canceling distortion components which are generated in the waveform generating part with respect to the signal waveform of the fundamental frequency to be generated;

(j) computing composite waveform data composed of the distortion canceling sine signal waveforms and the fundamental frequency signal waveform and writing the composite waveform data into the memory; and (k) reading out the composite waveform data from the memory, converting the read-out composite waveform data by the D/A converter to an analog waveform, amplifying the analog waveform by the amplifier, and outputting the amplified analog waveform as the signal waveform to be generated.

3. A waveform generator according to claim 1, wherein said memory means includes:

a first memory for storing said reference signal waveform when a low-distortion waveform is generated; and a second memory for storing said canceling harmonic component waveform;

said D/A converter means includes:

a first D/A converter for converting said reference signal waveform read out of said first memory into an analog waveform; and a second D/A converter for converting said canceling harmonic component waveform read out of said second memory into an analog waveform; and said amplifier means includes:

first and second amplifiers, respectively, operatively connected to said first and second D/A converters, for amplifying the outputs of said first and second D/A converters; and adder means for adding the output of said second amplifier to the input of said first amplifier and inputting the added output into said first amplifier.

4. A waveform generator of claim 3, further comprising an attenuator provided between the output of said second amplifier and the input of said adder means, for attenuating the output signal of said second amplifier by a predetermined rate.

* * * * *

UNITED STATES PATENT AND TRADEMARK OFFICE

CERTIFICATE OF CORRECTION

PATENT NO. : 5,113,139

DATED : MAY 12, 1992

INVENTOR(S) : YASUO FURUKAWA

It is certified that error appears in the above-identified patent and that said Letters Patent is hereby corrected as shown below:

Item [57], Abstract, line 16, "the memory, is fed via the notch filter and the A/D" should be deleted.

Col. 2, line 44, "10" should be deleted.

Col. 4, line 50, "such" should be deleted;
line 64, "amplifier" should be --amplifier 15--.

Col. 5, line 18, "Fourier 10." should be --Fourier transform analysis in the computation and control part 10.--.

Col. 6, line 47, "Where" should be --where--.

Col. 9, line 6, "$\theta$" (all occurrences) should be --$\delta$--;
line 11, "SJ" should be --Sj--.

Signed and Sealed this

Twenty-fourth Day of August, 1993

Attest:

BRUCE LEHMAN

*Attesting Officer* *Commissioner of Patents and Trademarks*